United States Patent [19]

Latham, Jr.

[11] Patent Number: 4,866,391
[45] Date of Patent: Sep. 12, 1989

[54] SYSTEM AND METHOD OF SIMULTANEOUSLY MEASURING A MULTIPLICITY OF GROUNDS ON UTILITY POLES

[75] Inventor: Harry L. Latham, Jr., Huntingdon Valley, Pa.

[73] Assignee: James G. Biddle Co., Blue Bell, Pa.

[21] Appl. No.: 193,351

[22] Filed: May 12, 1988

[51] Int. Cl.$^4$ .................. H02H 5/10; G01R 31/08
[52] U.S. Cl. .................. 324/509; 324/357; 324/529; 324/62; 324/65 R; 340/649
[58] Field of Search ............ 324/527, 529, 509, 510, 324/65 R, 62, 357, 358, 359, 360; 340/649

[56] References Cited

U.S. PATENT DOCUMENTS

| | | | |
|---|---|---|---|
| 2,137,650 | 11/1938 | Jakosky | 324/357 |
| 2,176,760 | 10/1939 | Borden | 324/357 |
| 3,996,496 | 12/1976 | Volk | 340/649 |
| 4,153,923 | 5/1979 | Graf | 324/510 |
| 4,546,309 | 10/1985 | Kang | 324/509 |

OTHER PUBLICATIONS

IEEE Guide for Measuring Earth Resistivity, Ground Impedence, and Earth Surface Potentials of a Ground System, IEEE STD 81-1983 (Revision of IEEE STD 81-1962).
Grounding, Bonding and Shielding Practices and Procedures for Electronic Equipments and Facilities, Report No. FAA-RD-75-215, I (Chapter I only), 1962.

*Primary Examiner*—Reinhard J. Eisenzopf
*Assistant Examiner*—Jose M. Jolis
*Attorney, Agent, or Firm*—Dann, Dorfman, Herrell and Skillman

[57] ABSTRACT

Grounding of poles in a power distribution system is checked by disconnection of the ground wire from the buried grounding conductor (rod) and measurement of the reference ground by conventional techniques. If necessary the grounding conductor is enlarged to lower ground resistance to an acceptable level between 5 and 10 ohms. A pulse generator is then connected between the grounding conductor and the ground lead at the reference pole to generate and transmit through the system netural wire a pulse, preferably on the order of 5 kHz to simulate lightning strikes on the systme neutral. Adjacent poles are then checked one at a time using a current type pickup with peak detector equipment. It is necessary to disconnect the ground wire from the ground connector. A first value is obtained by checking the effects of a pulse in the neutral wire of the distribution system adjacent the selected pole and the output is adjusted by a potentiometer to read 100. Then the pickup is moved to the ground wire and a measurement is made as a pulse passes through the system. The output shown on the meter is in terms of the percentage of the current taken at the neutral. That percentage is applied to a lookup table created by a simulated system in order to give the ground resistance at the selected pole. Additional ground conductors may be added if necessary until ground resistance is sufficiently low. The process is repeated from pole to pole. Equipment is provided in the system to give the input pulse and make current detection at each selected pole using a peak detection reading.

9 Claims, 2 Drawing Sheets

SYSTEM AND METHOD OF SIMULTANEOUSLY MEASURING A MULTIPLICITY OF GROUNDS ON UTILITY POLES

The present invention relates to a method and equipment for testing for the adequacy of grounds, particularly at utility poles, in an electric utility transmission line power distribution system. More specifically, the present invention makes possible simplified sequential measurement of effective resistance of grounds on a multiplicity of utility poles.

BACKGROUND OF THE INVENTION

It is well known by those in the field of transmission and distribution of electrical energy that the continuity of service during electrical storms is highly dependent on the quantity and quality of the grounds in the vicinity of a lightning strike. Not incidentally, the damage done to cables, transformers and other apparatus is significantly reduced by adequate grounding. Therefore, one of the primary preventive maintenance activities currently by electric utilities is to check and improve as necessary all distribution pole grounds. Every pole in a distribution system should have a ground connection of sufficiently low ohmic value to safely conduct away the current caused by a lightning strike at or near the pole. The magnitude of the task of checking grounds is only appreciated when one considers that a large utility may have as many as 500,000 poles in the distribution system.

The presently accepted way of measuring the resistance of a ground is by the use of a ground resistance tester such as the Biddle Megger® instruments (Cat. No.'s 250260 and 250241) through the buried grounding conductor (ground rod). Such measurement requires a two or possibly three terminal mesurement to obtain sufficient accuracy. Typically, a single ground rod measurement is made employing the three terminal technique. For reasonable accuracy it is necessary in a typical test, for example, to place a potential electrode at 31 ft. from the rod under test and the current electrode at 50 ft. This is obviously a time consuming task when one considers the time required to dig down as much as 12 inches, break the neutral system grounding wire connection to the rod and remake the connection after the test. If lower accuracy is acceptable, a two terminal measurement may be made. This test nevertheless requires breaking the neutral to ground rod connection and making the measurement between the system neutral and the ground rod. Again the connection must be remade after the test. It is estimated that even the two terminal test could take from 20 to 30 minutes to do, employing a two man crew. At a cost which amounts to $33 to $50 cost per pole. This multiplies to 17 to 25 million dollars for a large system.

From these estimates it is clear that a system is needed to test at least 10 to 20 poles at a time. This necessitates making a ground measurement without breaking the individual grounding wire (neutral) to ground rod connection of all of the poles.

NATURE OF THE PRESENT INVENTION

The present invention is directed to a method and system of testing grounding at multiple poles, breaking the ground connection between the grounding wire and the ground rod at only one of the poles to do the testing. The measurement must be done with alternating or changing current of substantial amplitude in order to use a simple current transformer to couple the signal to a detector circuit. The frequency should be high relative to the line frequency to permit good discrimination of the test signal. Also, a frequency somewhat higher than the line frequency will still propagate along the neutral line sufficiently well to permit a measurement to be made on several poles on either side of the pole at which the test current is introduced. If the frequency is not too high, say below 20 khz, it will not be cut off by the distributed inductance of the neutral wire. Also, the inductive reactance of the earth is small compared to a low resistance ground connection of 5 ohms at 5 khz. This frequency choice will insure reasonable correlation between the low frequency Earth Tester measurements and those of the impulse test.

Also, the frequency spectrum of a standard impulse test wave ($1.2 \times 50$ $\mu$s) (lightning pulse) contains frequencies in the range of 1.5 to 5 kHz. These frequency components are the result of the relatively long tail of the pulse. Therefore, it is preferable to impulse test a ground system within or adjacent to the same range of frequencies.

More specifically the present invention relates to a method for use in a power distribution system of determining whether each of a plurality of tested adjacent poles, each having a grounding wire connected between a neutral wire in the distribution system and a buried grounding conductor, is properly grounded. The method involves selecting a reference pole and disconnecting its grounding wire from its buried grounding conductor and connecting between them a cable fault locator impulse generator. A ground configuration test known in the art, such as the two terminal or three terminal configuration, is set up. A detection means is coupled through a current pickup to the grounding wire of the reference pole. Then an impulse from the impulse generator is applied to determine the effective ground resistance of the series of adjacent poles using reference tables. These tables are obtained from an analysis of the model or analog system. Table A is a compilation of average pole resistances (normalizing factors) versus the reference pole resistances and gain settings by a potentiometer.

Thereafter another pole adjacent the reference pole is selected and the current pickup of the detector means coupled to the grounding wire of the selected pole. With the cable fault locator impulse generator remaining in place at the reference pole a test impulse is provided to determine the effective ground resistance at the selected pole. A ratio of the currents sensed in the neutral wire to the selected pole and the selected pole ground wire is calculated to determine from a second set of reference tables the selected pole ground resistance. Table B is a compilation of selected pole resistances versus the average pole resistances obtained from Table A and the currents ratios from the selected poles The method permits the procedure to be repeated selecting other poles one at a time and coupling the current pickup of the detector means to the neutral wire, to the selected pole and to the grounding wire without disconnecting it from the grounding conductor. Then, a test impulse is applied from the reference pole to determine the pole's effective ground resistance. The procedure is repeated at each selected pole.

The present invention also contemplates a system for measuring the effectiveness of power distribution system pole grounding in which a system neutral wire is connected to grounding conductors at each of the poles by a grounding wire. The system employs a pulse generator connectable between an opened grounding conductor and its grounding wire for generating an impulse transmitted to the system neutral wire and grounding wires. A current pickup means for cooperation with grounding wires on various poles is coupled to means for detecting peak current. From the peak current measurement the amount of resistance to ground or the adequacy of grounding conductors at a particular pole may be assessed.

The current pickup means is preferably a current transformer pickup feeding a peak detecting circuit. The current transformer feeds a step-gain-adjustable band-pass amplifier through a potentiometer and outputs to an absolute value circuit prior to the peak detector circuit. Switch means preferably enables either automatic or manual reset of the peak detector circuit and meter. The automatic reset is connected into the circuit before the peak detector and acts through means to actuate a switching circuit and relay. The automatic reset circuit may include in succession, for example, a comparator circuit, a timing circuit, a one shot multivibrator and the switching circuit and relay.

In order to make the present invention practical it was necessary to create a model or analog of a typical utility power line distribution system. Various conditions of the system were created and measurements similar to those described for use in the field were applied to the model to create a table of values of ground resistance applicable under stated conditions of operation. As a practical matter this table was placed in the memory of a computer to which ground resistance values obtained under specified conditions of use were stored so that for input of specified currents (or current ratios) an appropriate value of ground resistance could be retrieved.

DRAWINGS OF A PREFERRED EMBODIMENT OF THE PRESENT INVENTION

Reference is made to the accompanying drawings illustrating the present invention in which:

FIG. 1A is a detail inset showing the break between the grounding line and ground rod and separate test connections to each.

Figure 1:
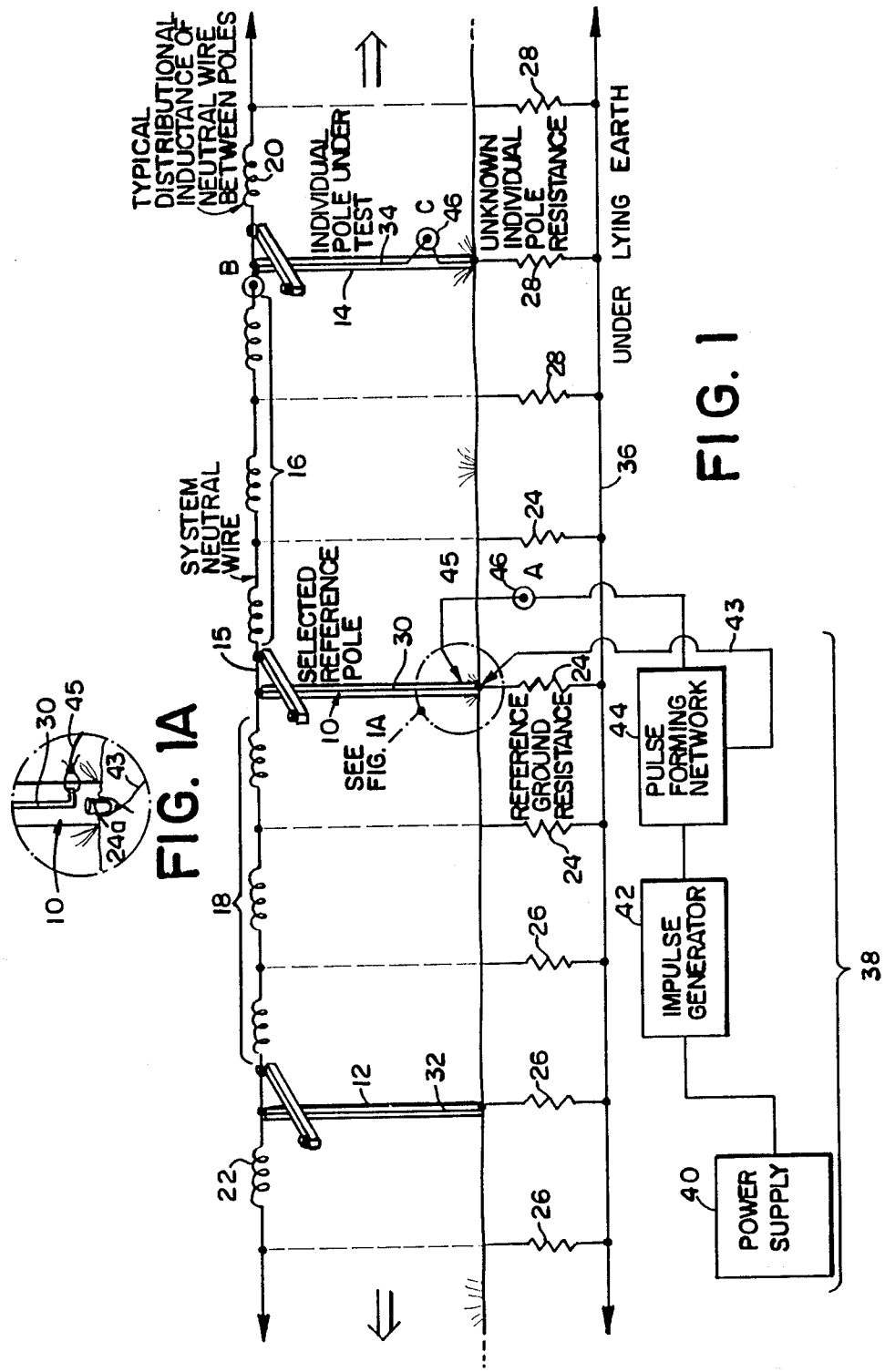
FIG. 1 is a schematic representation of the equivalent circuit showing in its pole grounded neutral transmission line environment.

FIG. 1 is meant to schematically represent a small but representative portion of pole grounding means under test. An equivalent circuit of a row of 10 to 20 grounded poles spaced at a typical distance apart of 250 ft. is simply a repetitive extension in both directions from the selected reference pole of the system here representing only a part of the distance beyond the next adjacent poles on opposite sides of the selected reference pole. The dominant elements of the circuit are the inductive reactance of the neutral wire 15 between the poles and the resistance of the individual pole ground resistance to the underlying low impedance earth. The neutral wire resistance between the poles (0.15 to 0.27 ohms) and the inductive reactance of the ground connection to the earth (0.7 ohms at 5 khz) are both negligible at these frequencies. As a matter of information, the inductance between poles is about 130 microhenries (4 ohms at 5 khz) and the resistance at each pole is dependent on many factors and varies from 5 to 150 ohms.

The equivalent circuit for a few of a row of tested power poles and the technique for the impulse method of ground measurement is illustrated in FIG. 1. The equivalent circuit of a row of three gounded power poles, 10, 12 and 14 spaced at a typical distance of 250 ft. apart serves as a partial representation of a larger group under test, the equivalent circuits between being repeated from pole to pole. The equivalent circuit is composed of the typical inductive reactance 16, 18, 20, 22 of the neutral wire in the power lines extending between the poles and the distributed ground resistances 24, 26, 28 of the individual poles. The poles have grounding wires 30, 32, 34 each connected to a buried grounding conductor, usually a ground rod, as a direct connection to ground resistances 24, 26, 28. These ground resistances can be measured by known and conventional methods to the underlying earth 36. The resistance of the neutral wire between the poles is negligible but inductance 16, 18, 20 and 22 is significant. The inductive reactance of the ground connection to the underlying earth 36 is negligible at the test frequency of 5 kHz.

Figure 2:
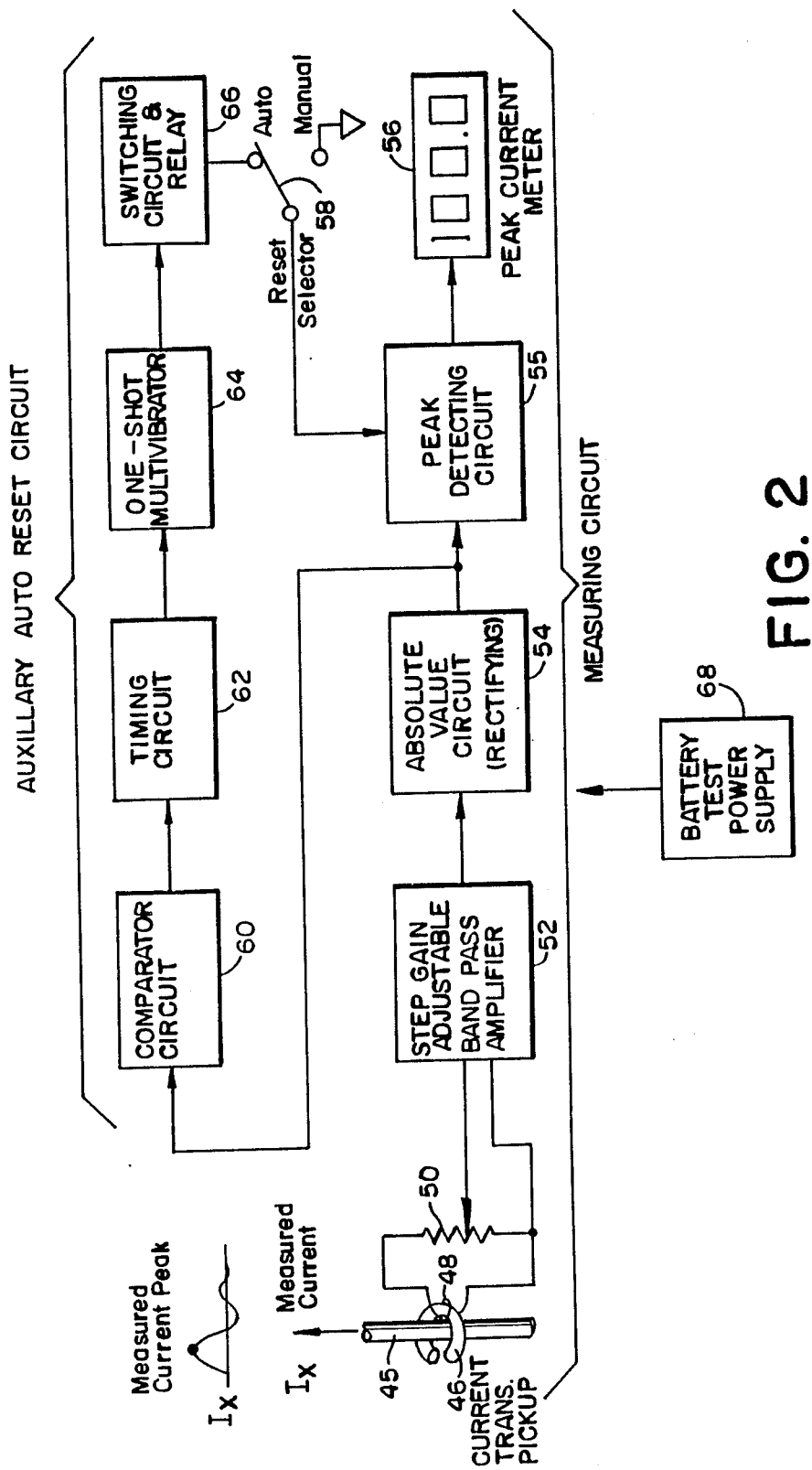
FIG. 2 is a block diagram of a preferred embodiment of the current pickup and detector for impulse ground testing.

The peak current to be measured in the conductor 45 is measured by a current transformer pickup 46. As seen in FIG. 2, a detector has been designed to act as the measuring instrument for the system. The pickup is a tape wound loop core with a cutout section large enough to accept the largest of neutral wires in a distribution system and introduce it into the core loop. A secondary winding 48 is wound on the back of the "C". The number of turns and load resistor is selected to attenuate the power frequency and its harmonics and pass 500 Hz and above. The entire assembly is insulated with an overall rubber molding and equipped with a "hot-stick" fitting. This construction permits the current measurement to be made from the ground level by simply hooking the pickup over the neutral wire under test.

The output of the pickup is fed to a precision gain potentiometer 50 and then to a step-adjustable-gain bandpass amplifier 52 in the detector. These standard circuits provide the necessary gain and frequency discrimination. An absolute value circuit 54 (precision full-wave rectifier) permits the pickup to be hooked on the wire in either direction with no change in the reading. A peak detector 55 measures and holds the peak reading of current on the peak current meter 56 until it is reset either manually or automatically, as selected by the switch 58.

An auxiliary circuit provides automatic rest of the peak current meter when selected by a front panel switch 58. The automatic reset selector switch resets the peak current meter 56 reading to zero just before the next transmitter pulse. The transmitter injects a pulse about every six seconds. Alternatively when selector switch is placed on "manual" resetting is done by hand. The reset circuit is composed of a comparator 60, timer 62, one shot multivibrator 64 and a relay circuit 66. The comparator 60 trips on the incoming pulse signal and sets the 5 second timer 62. The timer 62, when timed out, in turn- sets the 0.2 second one-shot multivibrator 64 which operates the relay 66 and discharges the peak detecting circuit 54, resetting the meter to zero.

A test frequency is preferably selected in the vicinity of 5 kHz, the upper end of the range of frequencies experienced in a lightning strike. This is well above the 60 Hz line frequency, so that the effects of the line frequency and the harmonics of it are reduced to a negligible amount. It is below a frequency range that would severely limit the number of poles tested at one time and introduce the reactive effect of the earth. However, the selection of another frequency does not render testing impossible and is contemplated in special situations where other problems make testing in the vicinity of 5 kHz difficult.

In order to hold the power requirements to a manageable level and still provide currents in the order of 500 amperes, a pulse system was selected. A Cable Fault Locator (CFL) 38, seen schematically shown in FIG. 1, of the impulse type with an internal impulse capacitor of 1 to 4 microfarads is well suited as such a pulse generator. It requires a power supply 40, an impulse generator 42 and pulse forming network 44 connected by line 43 to the ground by a ground rod 24a as seen in insert FIG. 1A and connected by line 43 to the ground by a ground rod 24a (grounding conductor) as seen in inset FIG. 1A and connected by line 45 to a selected reference pole neutral 30 which has been disconnected from its grounding rod 26. When such a pulse generator is discharged into a typical distribution neutral network through a suitable waveshaping network, the result is a damped oscillatory waveform as seen in FIG. 2 with a resonant frequency of about 5 khz and a damping factor of 0.8. Thus, a slightly modified standard CFL generator ("thumper") is well suited to be the impulse generator 42 of the proposed impulse ground testing system 38.

A current transformer pickup and detector as seen in FIG. 2 and represented in FIG. 1 as pickup 46 preferably acts as the measuring instrument for the system. The pickup is a tape wound core with a cutout section leaving a C-shaped core, the cutout being large enough to accept the largest of neutral wires in a distribution system. During testing the pickup 46 is moved from pole to pole starting with the selected reference pole 10 in the position A and then moved to other poles, e.g., positions B and C pole 14, as the test progresses.

The procedure for measuring the ground resistance of a number of poles is preferably done in the following steps:

Step One

This step is necessary to establish the reference ground resitance 24 by directly measuring the ground rod 24a at a selected pole 10 with a Megger ® Earth Tester shown in inset FIG. 1A. The reference pole 10 is selected to be in the middle of a section of poles 12, 14, ... to be measured. This measurement requires breaking the connection to the system neutral wire 30 and the selected pole ground rod 24a, as seen in FIG. 1A. The reference pole ground resistance 24 is measured directly with the Earth Tester using the two terminal measurement scheme between the pole grounding wire 30 and the pole ground rod 23a. Either the two terminal or three terminal method may be used as described in "Getting Down to Earth, A Manual on Earth Resistance Testing for the Practical Man", Biddle Publication 25Ta may be used. The grounding rod 24a must have a ground resistance 24 of less than 10 ohms, and preferably 5 ohms or less. If resistance is too high, additional grounding rods may be buried and connected in parallel to those originally present, for example, to reduce ground resistance which should be remeasured and recorrected until an acceptable lead is reached.

Step Two

This step involves the measurement using current detector 46 of the output current (at location A) from the generator 42 and pulse forming network 44 into the system neutral via line 45 and pole grounding connector 30. A value of average pole resistance (a normalizing factor) is determined from a computer generated look-up table (Table A). This table is obtained from an analysis of the model system.

The value of gain setting at the potentiometer 50 (FIG. 2) required to produce a 100.0 reading on the meter as the impulse current passes point A and the value of the reference pole resistance 24 are needed for this determination. The voltage on the capacitor of the CFL 42 must be set and maintained at a reference value throughout all of these steps.

Step Three

This step completes the measurement of an individual pole ground resistance 28. The pickup 46 (FIG. 2) is hooked over the neutral on the side of the pole grounding wire 30 nearer the generator (at location B) to measure the peak current flowing into the selected pole 14. The variable gain potentiometer 50 (FIG. 2) is set to produce a meter reading of 100.0. Without changing the gain setting a measurement is made of the peak current travelling down the selected pole grounding wire 34 (at location C). This reading is the percentage of current into the individual pole ground 28. From a second computer generated look-up table (Table B) a value of the individual pole ground resistance 28 is determined, using the average value from Step Two and the percentage value from above. This is repeated to the left and right of the reference pole 10 until the limit of detector sensitivity is reached. This may be as many as 10 to 12 poles on either side of the reference pole 10.

Step Four

After testing as many pole grounds as possible, the results are evaluated and any poles 24, 26 and 28 with ground resistance higher than acceptable are noted. These resistances are lowered by driving additional ground rods and connecting in parallel with the existing ground. Then measurements are made using a conventional Earth Tester, since the ground connection must be broken to improve the ground resistance.

Step Five

This final step is a repeat of Step Two. This should yield a higher value of peak current into the system neutral than was originally measured in Step Two.

The detector is portable, lightweight and battery powered to permit one man to make the required measurements as he moves from pole to pole.

It will be understood by those skilled in the art that the term "pole" as used herein means is intended to apply to other grounded structures in the power distribution system. Other terms relating to equipment are intended to be applied in the broad sense of including equivalents which produce similar results.

The scope of the present invention is determined by the scope of the claims appended hereto.

I claim:

1. The method for use in a power distribution system of determining whether each of a plurality of tested adjacent poles, each having a grounding wire connected between a neutral wire in the distribution system and a buried grounding conductor, is properly grounded, comprising:

selecting a reference pole and disconnecting its grounding wire from its buried grounding conductor and connecting between them a cable fault locator impulse generator and setting up for a ground test as is known in the art, coupling a detection means through a current pickup to the grounding wire of the reference pole, and applying an impulse to determine the effective ground resistance at the reference pole using reference tables;

selecting another pole adjacent the reference pole and coupling the current pickup of the detector means to the neutral wire coming from the impulse generator through the grounding wire of the selected pole, with the cable fault locator impulse generator remaining in place at the reference pole, coupling the current pickup of the detector means to the ground wire of the selected pole and providing a test impulse at the selected pole; and calculating a ratio of the currents sensed at the neutral wire to the selected pole and selected pole ground wire to determine from reference tables the selected pole ground resistance.

2. The method of claim 1 in which the procedure of selecting other poles one at a time and coupling the current pickup of the detector means to the grounding wire and applying a test impulse to determine the effective ground resistance is repeated at each selected pole.

3. The method of claim 2 in which the impulse applied is a 5 kHz pulse.

4. A system for measuring the effectiveness of power distribution system pole grounding in which a system neutral wire is connected to grounding conductors at various poles by a grounding wire comprising:

a pulse generator connectable between an opened grounding conductor and its grounding wire for generating a current impulse;

a current pickup means for cooperation with grounding wires without breaking connections to a selected ground and coupled to means for detecting peak current; and means for calculating a ratio between the detected peak current and the current impulse and for determining from a look up table the selected ground resistance value.

5. The system of claim 4 in which the current pickup means is a current transformer pickup feeding a peak detecting circuit.

6. The system of claim 5 in which the current transformer feeds a stepwise gain-adjustable band-pass amplifier through a potentiometer and outputs to an absolute value circuit prior to the peak detector circuit.

7. The system of claim 5 in which the peak detecting circuit feeds a peak current meter.

8. The system of claim 7 in which switch means enables either automatic or manual reset of the peak detector circuit and meter, the automatic being connected into the circuit before the peak detector through means to actuate a switching circuit and relay.

9. The system of claim 8 in which the automatic reset circuit includes in succession a comparator circuit, a timing circuit, a one shot multivibrator and a switching circuit and relay.

* * * * *